(12) United States Patent
Kondo

(10) Patent No.: US 11,641,118 B2
(45) Date of Patent: May 2, 2023

(54) METHODS AND APPARATUS FOR A BATTERY SYSTEM TO CONTROL LEAKAGE AT TERMINALS

(71) Applicant: SEMICONDUCTOR COMPONENTS INDUSTRIES, LLC, Phoenix, AZ (US)

(72) Inventor: Hideo Kondo, Oizumi-machi (JP)

(73) Assignee: SEMICONDUCTOR COMPONENTS INDUSTRIES, LLC, Scottsdale, AZ (US)

(*) Notice: Subject to any disclaimer, the term of this patent is extended or adjusted under 35 U.S.C. 154(b) by 303 days.

(21) Appl. No.: 16/948,809

(22) Filed: Oct. 1, 2020

(65) Prior Publication Data

US 2022/0014034 A1 Jan. 13, 2022

Related U.S. Application Data

(60) Provisional application No. 62/705,720, filed on Jul. 13, 2020.

(51) Int. Cl.
| | |
|---|---|
| *H02J 7/00* | (2006.01) |
| *G01R 31/3842* | (2019.01) |
| *H01M 10/42* | (2006.01) |
| *H01M 10/44* | (2006.01) |

(52) U.S. Cl.
CPC ...... *H02J 7/00306* (2020.01); *G01R 31/3842* (2019.01); *H01M 10/425* (2013.01); *H01M 10/448* (2013.01); *H02J 7/00034* (2020.01); *H02J 7/00036* (2020.01); *H02J 7/0048* (2020.01); *H02J 7/00302* (2020.01); *H01M 2010/4271* (2013.01); *H01M 2010/4278* (2013.01)

(58) Field of Classification Search
CPC .. H02J 7/00306; H02J 7/0048; H02J 7/00034; H02J 7/00036; H02J 7/00302; G01R 31/3842; H01M 10/425; H01M 10/448; H01M 2010/4271; H01M 2010/4278
USPC ....................................................... 320/136
See application file for complete search history.

(56) References Cited

U.S. PATENT DOCUMENTS

| | | | |
|---|---|---|---|
| 9,018,910 B2* | 4/2015 | Kim ................... | H02J 7/00304 320/128 |
| 9,035,618 B2* | 5/2015 | Lee ....................... | H02J 7/0031 320/136 |
| 2012/0126820 A1 | 5/2012 | Tan | |
| 2012/0275101 A1* | 11/2012 | Johnson ............. | G01R 31/3842 324/426 |
| 2014/0253041 A1* | 9/2014 | Takeda ................. | H01M 10/42 320/134 |
| 2019/0074683 A1 | 3/2019 | Uesugi | |
| 2019/0280341 A1* | 9/2019 | Li ........................ | H02J 7/0031 |
| 2021/0159551 A1* | 5/2021 | Maeda ................. | H01M 10/441 |

FOREIGN PATENT DOCUMENTS

WO    WO 2009/085915    * 7/2009

* cited by examiner

*Primary Examiner* — Nathaniel R Pelton
(74) *Attorney, Agent, or Firm* — Dickinson Wright PLLC

(57) ABSTRACT

Various embodiments of the present technology may provide methods and apparatus for a battery system. The apparatus may provide a fuel gauge circuit that operates in conjunction with a protection circuit to control discharging and/or current leakage at exposed terminals of the apparatus.

20 Claims, 4 Drawing Sheets

METHODS AND APPARATUS FOR A BATTERY SYSTEM TO CONTROL LEAKAGE AT TERMINALS

CROSS-REFERENCE TO RELATED APPLICATIONS

This application claims the benefit of U.S. Provisional Patent Application No. 62/705,720, filed on Jul. 13, 2020, the entire contents of which is incorporated herein by reference.

BACKGROUND OF THE TECHNOLOGY

A "battery pack," which houses a battery, typically has a number of exposed terminals prior to being integrated into a larger host system. During the time when the terminals are exposed (e.g., during shipping), there is a high risk of current leakage at the terminals and short circuit, which may result in undesirable battery states that can lead to dangerous operating conditions. In addition, some host systems are prone to high current leakage, resulting in excessive discharging of the battery.

SUMMARY OF THE INVENTION

Various embodiments of the present technology may provide methods and apparatus for a battery system. The apparatus may provide a fuel gauge circuit that operates in conjunction with a protection circuit to control discharging and/or current leakage at exposed terminals of the apparatus.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various voltage sensors, current sensors, coulomb counters, logic gates, timers, memory devices, switches, semiconductor devices, such as transistors and capacitors, and the like, which may carry out a variety of functions. In addition, the present technology may be integrated in any number of electronic systems, such as automotive, aviation, "smart devices," portables, e-cigarettes, aroma therapy puff systems, vaping devices, and consumer electronics, and the systems described are merely exemplary applications for the technology.

Figure 1:
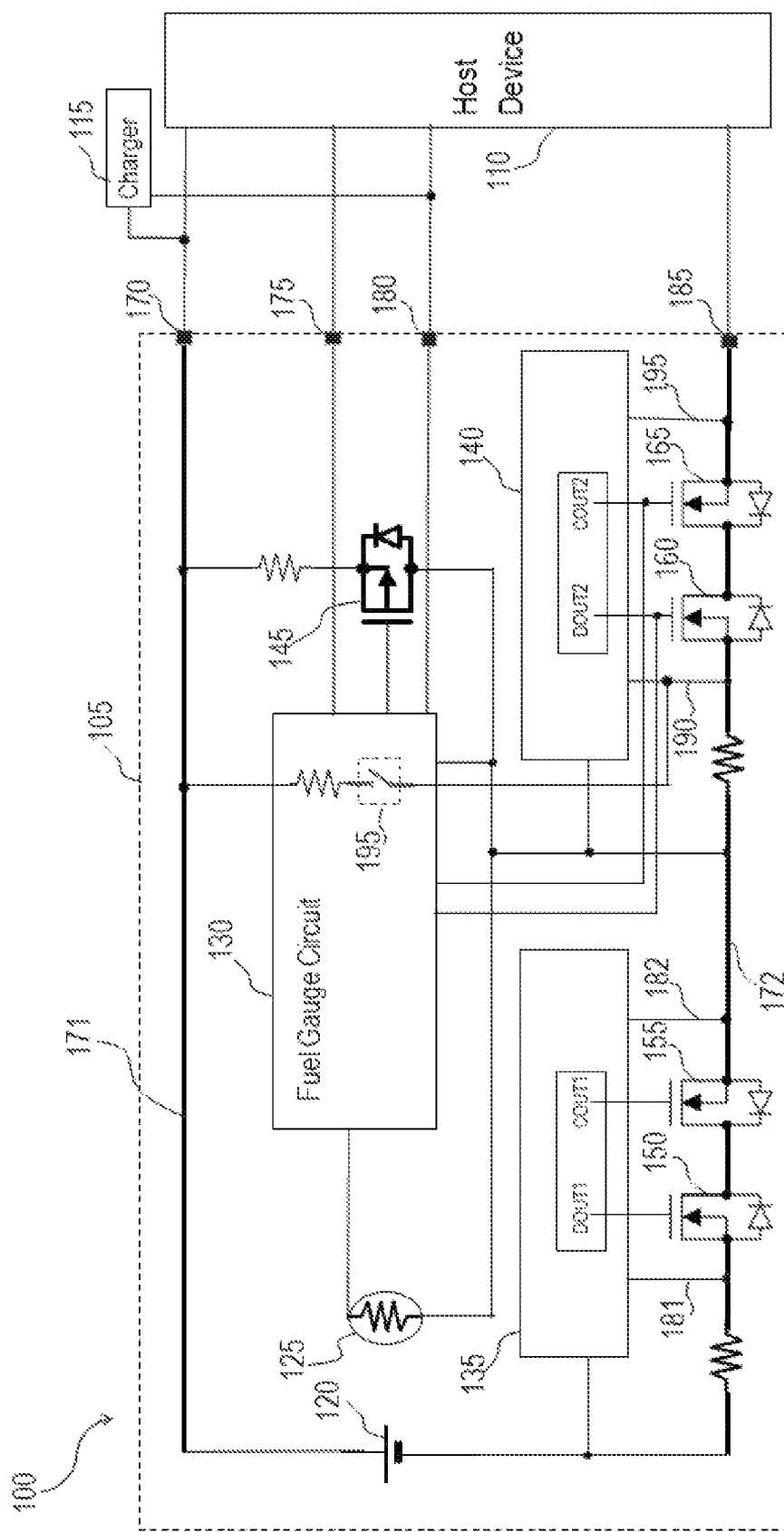
FIG. 1 is a block diagram of a battery system in accordance with an exemplary embodiment of the present technology.
Figure 2:
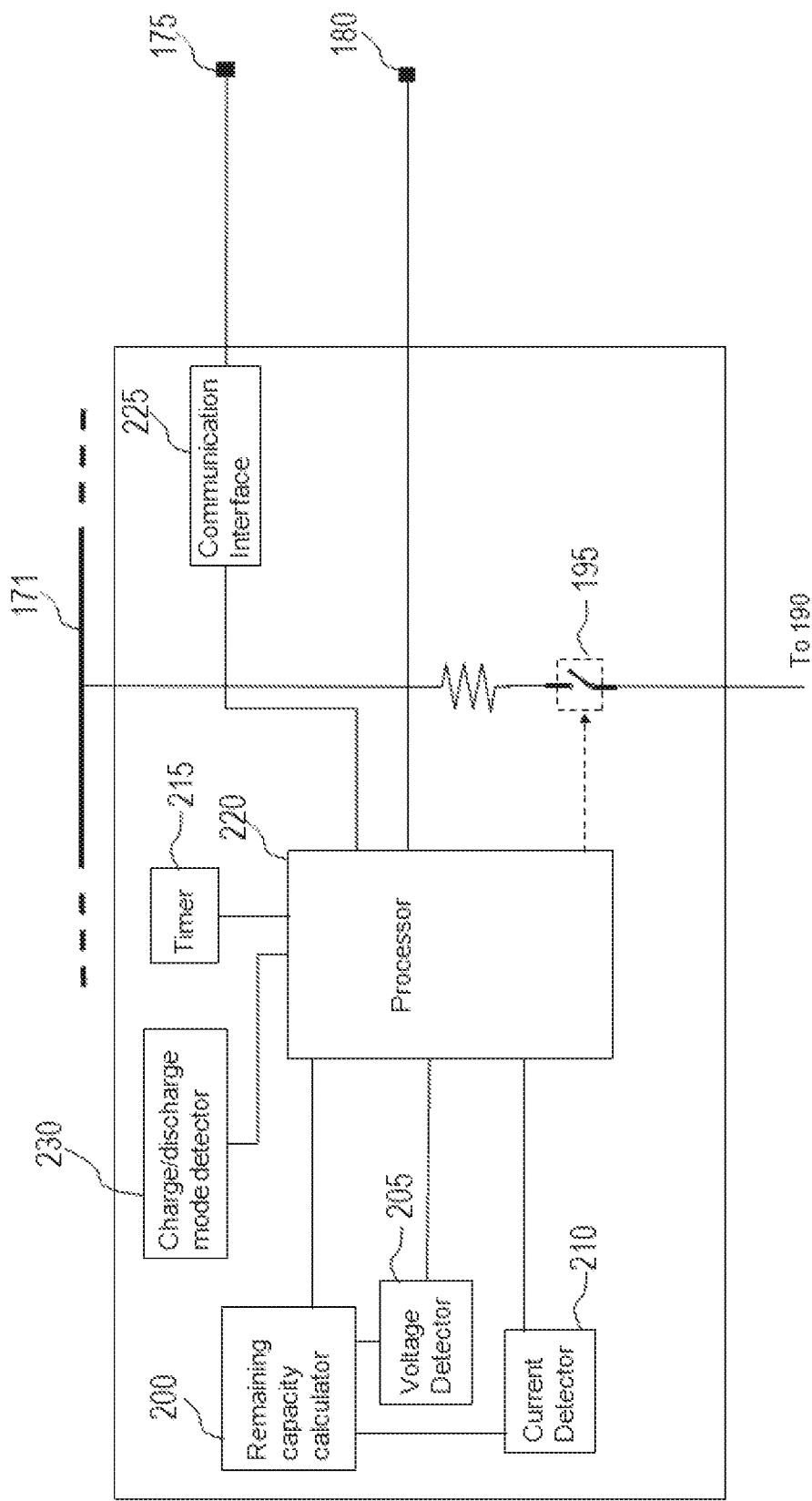
FIG. 2 is a block diagram of a fuel gauge circuit in accordance with an exemplary embodiment of the present technology.
Figure 3:
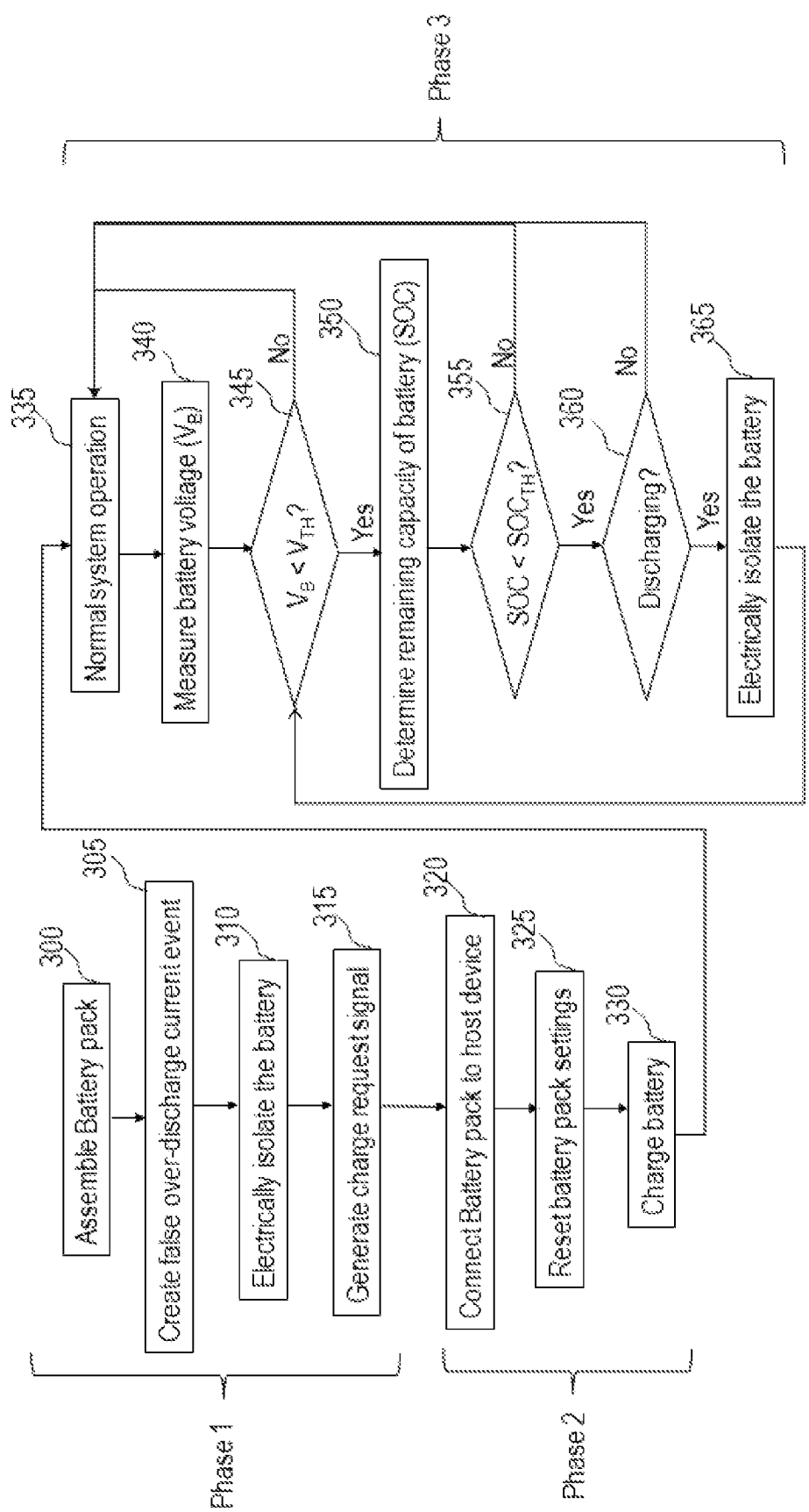
FIG. 3 is an operation flow chart in accordance with an exemplary embodiment of the present technology.

Methods and apparatus for a battery system according to various aspects of the present technology may operate in conjunction with any suitable electronic system and/or device, such as "smart devices," wearables, battery-powered consumer electronics, portable devices, battery-powered vehicles, and the like. Referring to FIG. 1, a system 100 may comprise a battery pack 105, a charger 115, and a host device 110 (i.e., a load). The battery pack 105 and host device 110 may be integrated in an electronic device (not shown), such as a smart watch or an electric vehicle.

In various embodiments, the battery pack 105 may provide power to the host device 110 and monitor various conditions of the battery 120, such as over-voltage (excessive voltage), under-voltage, over-current (excessive current), and under-current (short circuit). If a particular condition/event is detected, the battery pack 105 may be configured to initiate a charging operation (such as in the case of under-voltage) and initiate a self-discharging operation (such as in the case of over-voltage). In an exemplary embodiment, the battery pack 105 may comprise a battery 120, such as a rechargeable battery (e.g., a lithium ion battery or other rechargeable battery type), a fuel gauge circuit 130, and a recovery control device 145. In various embodiments, the battery pack 105 may operate in conjunction with the charger 115 to provide power to the rechargeable battery 120.

In an exemplary embodiment, the battery pack 105 may further comprise a plurality of terminals, such as a first terminal 170, a second terminal 175, a third terminal 180, and a fourth terminal 185. Each terminal may be configured as an input/output (I/O) terminal. The first terminal 170 may connect to a positive terminal of the battery 120, the fuel gauge circuit 130, and the recovery control device 145 via a first power line 171. The second terminal 175 may connect to the fuel gauge circuit 130 and may be used to connect the battery pack 105 to the host device 110. The third terminal 180 may connect the fuel gauge circuit 130 and may be used to connect the battery pack 105 to the charger 115. The fourth terminal 185 may connect to the negative terminal of the battery 120 via a second power line 172.

In various embodiments, the battery pack 105 may further comprise at least one protection control circuit configured to detect over-charge events and over-discharge events. In an exemplary embodiment, the battery pack 105 may comprise a first protection control circuit 135 and a second protection control circuit 140, wherein each protection control circuit operates independently from the other and independently monitors for over-charge events and over-discharge events based on the voltage and current of the battery 120. The protection control circuits 135 may also be configured to determine whether the battery 120 is charging or discharging based on the current through the second power line 172 and/or battery voltage 172. In various embodiments, each protection control circuit 135, 140 may comprise various circuits to detect voltage and current of the battery 120.

In an exemplary embodiment, each protection control circuit 135, 140 may comprise a first current monitor terminal (such as terminals 181 and 190) to monitor the current of the battery 120 and a second voltage monitor terminal (such as terminals 182, 195) to monitor the voltage of the battery 120. The first terminals 181, 190 may be connected to the second power line 172 and may be configured to detect or otherwise sense the current of the battery 120/the second power line 172. The first terminals 181, 190 may be connected to internal circuitry (not shown) of the respective protection control circuit that is configured to detect if the current is too low (e.g., below a first threshold value) or if the current is too high (e.g., above a second threshold value). The second terminals 182, 195 may be connected to internal circuitry (not shown) of the respective protection control circuit that is configured to detect if the voltage is too low (e.g., below a third threshold value) or if the voltage is too high (e.g., above a fourth threshold value). For example, the internal circuitry (not shown) may comprise a number of comparators to compare the actual (measured) current and voltage to the various threshold values to determine if the current is too high or too low or if the voltage is too high or too low.

In an exemplary embodiment, the fuel gauge circuit 130 may be connected to terminal 190 of the second protection control circuit 140 and may be configured to bias the terminal 190.

In an exemplary embodiment, the over-charge events comprises over-current charging (i.e., excessively high current during a charging operation, and referred to as a type-2 over-charge event) and over-voltage charging (i.e., excessively high battery voltage during a charging operation, and referred to as a type-1 over-charge event). The over-discharge events comprises over-current discharging (i.e., excessively high current during a discharging operation, and referred to as a type-2 over-discharge event) and under-voltage discharging (i.e., excessively low voltage during a discharging operation, and referred to as a type-1 over-discharge event).

In an exemplary embodiment, the battery pack 105 may further comprise a number of charge/discharge control devices that are configured to control current through the battery pack 105. For example, battery pack 105 may comprise a first discharge control device 150 and a first charge control device 155 that are controlled by the first protection control circuit 135 via a first control signal COUT1 and a second control signal DOUT1. The first control signal COUT1 may have a value of 0 or a value of 1. When COUT1=1, the first charge control device 155 is ON, and when COUT1=0, the first charge control device 155 is OFF. Similarly, the second control signal DOUT1 may have a value of 0 or 1. When DOUT1=1, the first discharge control device 150 is ON, and when DOUT1=0, the first discharge control device 150 is OFF.

In an exemplary embodiment, if the first protection control circuit 135 detects a high current or a high voltage during a charging operation, the first protection control circuit 135 generates COUT1=0 to disable (turn OFF) the first charge control device 155, thus preventing current from flowing from the battery pack 105 to the host device 110. If the first control circuit 135 detects a high current or a low voltage during a discharging operation, the first protection control circuit 135 may generate a DOUT1=0 to disable the first discharge control device 150, thus preventing current from flowing from the host device 110 to the battery pack 105.

The battery pack 105 may further comprise a second discharge control device 160 and a second charge control device 165 that are controlled by the second protection control circuit 140 via a first control signal COUT2 and a second control signal DOUT2. The first control signal COUT2 may have a value of 0 or a value of 1. When COUT2=1, the second charge control device 165 is ON, and when COUT2=2, the second charge control device 165 is OFF. Similarly, the second control signal DOUT2 may have a value of 0 or 1. When DOUT2=1, the second discharge control device 160 is ON, and when DOUT2=0, the second discharge control device 160 is OFF.

In an exemplary embodiment, if the second protection control circuit 140 detects a high current or a high voltage during a charging operation, the second protection control circuit 140 generates COUT2=0 to disable (turn OFF) the second charge control device 165, thus preventing current from flowing from the battery pack 105 to the host device 110 (and preventing current from flowing through the second power line 172). If the second control circuit 140 detects a high current or a low voltage during a discharging operation, the second protection control circuit 140 may generate DOUT2=0 to disable the second discharge control device 160, thus preventing current from flowing from the host device 110 to the battery pack 105 (and preventing current from flowing through the second power line).

In an exemplary embodiment, each of the first and second charge control devices 155, 165 and the first and second discharge control devices 150, 155 may comprise any switch device suitable for enabling/disabling current flow, such as a field-effect transistor or the like. In an exemplary embodiment, each of the first and second charge control devices 155, 165 and the first and second discharge control devices 150, 155 comprise an n-type FET.

The first and second charge control devices 155, 165 may be integrated into the second power line 172, such that current flowing through the second power line 172 also flows through the first and second charge control devices 155, 165.

In an exemplary embodiment, the battery 120, first and second power lines 171, 172, the fuel gauge circuit 130, and the first and second protection control circuits 135, 140 are encased in a single, physical package (not shown), wherein each of the battery 120, the fuel gauge circuit 130, and the first and second protection control circuits 135, 140 are accessible only through the battery pack terminals 170, 175, 180, 185. The physical package may comprise a number of sidewalls fitted together (such as in a rectangular shape) to contain the contents of the battery pack 120 and provide protection to the contents. The physical package may be formed from a plastic material or other suitable packaging material.

The fuel gauge circuit 130 may be configured to manage various battery operations and monitor various battery conditions. For example, the fuel gauge circuit 130 may be configured to measure a voltage $V_B$ of the battery 120, measure a current of the battery 120, compute a remaining capacity (also expressed as a percentage and referred to as the state of charge SOC) of the battery 120, compute a state of health (SOH) of the battery 120, estimate a lifespan of the battery 120, determine an energy capability of the battery 120, and the like. In an exemplary embodiment, the fuel gauge circuit 130 may comprise a switch 195, a remaining capacity calculator 200, a voltage detector 205, a current detector 210, a charge/discharge mode check circuit 230, a timer 215, and a processor 220.

In an exemplary embodiment, the fuel gauge circuit 130 may be in communication with at least one of the protection control circuits, such as a second protection control circuit 140. For example, the fuel gauge circuit 130 may receive various control signals from the second protection control circuit 140. For example, the fuel gauge circuit 130 may receive the signals (values) of DOUT2 and COUT2 generated by the second protection control circuit 140. In addition, the fuel gauge circuit 130 may be configured to apply a control signal (e.g., a bias voltage) to the second protection control circuit 140 to create a false over-current discharge event. In other words, when the fuel gauge circuit 130 applies the bias voltage to the terminal 190, the second protection control circuit 140 detects an over-current discharge event at terminal 190. It is a false over-current discharge event because the current being detected by the second protection control circuit 140 is not from the battery 120, but instead is coming from the fuel gauge circuit 130. As described above, when the second protection control circuit 140 detects the false over-current discharge event, the second protection control circuit 140 disables (turns OFF) the second discharge control device 160, thus preventing current from flowing from the battery 120, through the second power line 172, and to the fourth terminal 185.

In an exemplary embodiment, the voltage detector 205 may be configured to measure the voltage $V_B$ of the battery 120. The voltage detector 205 may be connected to the battery 120 and may comprise any circuit and/or device suitable for measuring a voltage potential of the battery 120.

The current detector 210 may be configured to measure or otherwise sense the current of the battery 120. The current detector 210 may comprise any circuit and/or device suitable for measuring the current of the battery 120. For example, the current detector 210 may operate in conjunction with a sense resistor (not shown) connected to the negative terminal of the battery 120, wherein the current detector 210 measures the voltage across the sense resistor to determine the current. The sense resistor may be integrated into the second power line 172.

The remaining capacity calculator 220 may be configured to compute the remaining capacity (also referred to as the "state of charge" (SOC)) of the battery 120 using the detected current of the battery 120 and/or the voltage of the battery 120. For example, the remaining capacity calculator 220 may be configured to integrate the current of the battery 120 over a period of time. This may be accomplished using the current detector 210 and tracking the current during charging and discharging operations. In one embodiment, the remaining capacity calculator 220 may compute the SOC according to the following:

$$SOC_t = SOC_{t_0} + \int_{t_0}^{t} \frac{\eta I}{C_n} dt$$

where $SOC_t$ is the estimated SOC at time t, $SOC_{t0}$ is the initial SOC when the estimation process starts, I is the current of the battery 120, η is the current efficiency, and $C_n$ is the nominal capacity of the battery 101. In general, utilizing the measured battery current to determine the remaining capacity is referred to as "coulomb counting."

Alternatively, or in addition to using the current, the remaining capacity calculator 220 may compute the remaining capacity of the battery 120 using the measured battery voltage. In some embodiments, this may be accomplished by measuring an open circuit voltage of the battery and selecting a corresponding remaining capacity value. In general, utilizing the measured battery voltage to determine the remaining capacity is referred to as the "voltage method."

The charge/discharge mode detector 230 may be configured to determine whether the battery 120 is charging or discharging. In an exemplary embodiment the charge/discharge mode detector 230 determines whether the battery 120 is charging or discharging based on the measured battery voltage, the remaining capacity, and battery characteristic data. The battery characteristic data may be stored in a memory (not shown). For example, the charge/discharge mode detector 230 may determine that the battery 120 is charging if the measured voltage is greater than an open circuit voltage value at a particular remaining capacity value. For example, if the remaining capacity is 70%, this may correspond to open circuit voltage value of 3.7V. If the measured voltage is less than 3.7V, this means the battery 120 is discharging. If the measured voltage is greater than 3.7V, this means the battery 120 is charging.

In an exemplary embodiment, the charge/discharge mode detector 130 may be in communication with the remaining capacity calculator 200 and/or the voltage detector 205, either directly or indirectly (e.g., via the processor 220), to receive the computed remaining capacity and the measured battery voltage.

In an exemplary embodiment, the timer 215 may be configured to measure an elapsed time by incrementing in value according to a clock signal (not shown). Each increment in value may be equivalent to 1 second (s), however the equivalent time value in seconds may be based on the frequency of the clock signal. The timer 215 may comprise any device and/or system suitable for measuring or otherwise counting time and that may be started, stopped, and/or reset at any time.

The processor 220 may perform various computations, carry out programmed instructions, perform logic functions, and the like. In addition, the processor 220 may be in communication with the communication interface 225, the remaining capacity calculator 220, the voltage detector 205, the current detector 210, the charge/discharge mode detector 230, and the timer 215. The processor 220 may be configured to receive or otherwise retrieve data and utilize the data from the remaining capacity calculator 220, the voltage detector 205, the current detector 210, the charge/discharge mode detector 230, and the timer 215 to operate the switch 195. In addition, the processor 220 may control operation of the timer 215 and track the value of the timer 215 when the timer 215 is operating (counting). For example, the processor 220 may transmit a control signal to the timer 215 that starts the counting operation of the timer 215.

The switch 195 may be responsive to the processor 220. For example, the switch 195 may be opened/closed based on a control signal from the processor 220. The switch 195 is connected between the first power line 171 and the current monitor terminal 190, thus allowing the current monitor terminal 190 to be electrically connected to the first power line 171 when the switch 195 is closed. The switch 195 may comprise any suitable switch device, such as a transistor, mechanical switch, analog switch, or the like.

The fuel gauge circuit 130 may further comprise a communication interface 225 configured to facilitate communication between the fuel gauge circuit 130 and the host device 110 via the third terminal 175. For example, the communication interface 225 may support I²C communication protocol and the third terminal 175 connect the fuel gauge circuit 130 to the host device 110 with an I²C communication bus.

The recovery control device 145 may be configured to enable the self-discharging operation in response to an over-voltage event. For example, the fuel gauge circuit 130 may enable (turn ON) the recovery control device 145, which provides a current path to discharge the battery 120.

The recovery control device 145 may comprise any switch device suitable for enabling/disabling a current path. In an exemplary embodiment, the recovery control device 145 may comprise a field-effect transistor (FET) comprising a gate terminal connected to the fuel gauge circuit 130 and responsive to the third control signal OUT1, a source terminal connected to a first terminal (e.g., a positive terminal) of the battery 120 and the first terminal 170 of the battery pack 105, and a drain terminal connected to a second terminal (e.g., a negative terminal) of the battery 120 and the fourth terminal 185 of the battery pack. In an exemplary embodiment, the recover control device 145 comprises a p-type FET.

In various embodiments, the battery pack 105 may further comprise a temperature sensor, such as a thermistor 125, suitably configured to monitor and report the temperature of the battery 120 and/or battery pack 130. The thermistor 125 may generate a voltage that corresponds to a temperature of the battery 120 and/or battery pack 130, and transmit the voltage to the fuel gauge circuit 130. The fuel gauge circuit 130 may use the measured temperature to determine the battery state of charge, internal resistance of the battery, and other parameters that are affected by temperature.

A first phase (phase 1) of operation may comprise assembly of the battery pack 105 at a battery pack manufacturing facility (300). After the battery pack 105 is assembled, the battery pack terminals (i.e., terminals 170, 175, 180, 185) may be exposed and not connected to anything. The battery pack terminals may remain exposed during shipping. In order to prevent current leakage or short circuit at the battery pack terminals (i.e., terminals 170, 175, 180, 185) during shipping, the fuel gauge circuit 130 may initiate process to electrically disconnect the battery 120 from the fourth terminal 185. In an exemplary embodiment, the fuel gauge circuit 130 creates a false over-current discharge event (305). For example, the processor 220 may detect (e.g., by way of the voltage detector 205) that the battery 120 has been electrically connected to the fuel gauge circuit 130 and, in response, transmit a control signal to the switch 195 to enable (close) the switch, thus connecting the first power line 171 to the current monitor terminal 190. By electrically connecting the current monitor terminal to the first power line 171, the signal on the current monitor terminal 190 increases, which is interpreted by the second protection control circuit 140 as an over-current event. When the second protection control circuit 140 detects the over-current event, it turns off the second discharge control device 160, thus electrically isolating the battery 120 (310) and preventing current from flowing from the fourth terminal if it comes in contact with another battery pack terminal during shipping. The fuel gauge circuit 130 may then generate a signal to request charging—the signal will be transmitted to the charger 115 after the battery pack 105 is electrically connected to the charger 115. In addition, the fuel gauge circuit 130 may transmit a control signal to the switch 195 to disable (open) the switch 195, thus preventing the current flow from the battery 120, through the first power line 171, and to the current monitor terminal 190. After the switch 195 has been disabled (open), the second protection control circuit 140 may keep the discharge control device 160 in a turned-off condition (also referred to as a latch mode) until a charge operation is started (e.g., by charging the battery 120 with the charger 115).

Once the battery pack 105 is shipped and reaches its destination, a second phase (phase 2) of operation may begin. The second phase may comprise electrically connecting the battery pack 105 to the host device 110 (320). The action of connecting the battery pack 105 to the host device 110 may then initiate a process by which the host device 110 signals to the fuel gauge circuit 130 to reset the battery pack settings to those used during normal operation. In addition, the battery pack 105 may be connected to the charger 115, and the second discharge control device 160 may be turned back on (enabled) soon after charging begins. Charging may begin as soon as the battery pack 105 is electrically connected to the charger 115.

After the battery 120 begins to charge, a third phase (phase 3) of operation may begin. The third phase may comprise operating the system 100 in a normal operation (335), where the protection control circuits 135, 140 are operating to detect actual over-current and over-voltage events and not the falsely-created over-current event described above. In addition, in the normal operation, the discharge control devices 150, 160 are enabled (ON) and the charge control devices 155, 165 are enabled (ON).

The third phase may further comprise utilizing the fuel gauge circuit 130 to independently monitor the system 100 for an over-discharge/under-voltage event. For example, the fuel gauge circuit 130 may measure the voltage of the battery (340) and compare the measured voltage to a threshold voltage $V_{TH}$ (345). If the battery voltage is not less than the threshold voltage, then the system 100/fuel gauge circuit 130 may continue to operate normally. If the battery voltage is less than the threshold voltage, then the fuel gauge circuit 130 may determine the remaining capacity of the battery (e.g., using the remaining capacity calculator 220) (350) and compare the computed remaining capacity to a threshold capacity value $SOC_{TH}$ (355).

If the computed remaining capacity is not less than the threshold capacity value, then the system 100/fuel gauge circuit 130 may continue to operate normally. The charge/discharge mode detector 230 may then determine if the battery 120 is discharging (360). If the battery 120 is not discharging (i.e., charging or in an open state), the system 100/fuel gauge circuit 130 may continue to operate normally.

If the battery 120 is discharging, the computed remaining capacity is less than the threshold capacity value, and the measured voltage is less than the threshold voltage, this may indicate that an over-discharge/under-voltage event has occurred. In such a case, the fuel gauge circuit 130 may initiate a process to electrically isolate the battery (365) by stopping discharging/current flow from the battery 120 to the host device 110 through the second power line 172. In an exemplary embodiment and in response to the detected over-discharge/under-voltage event, the fuel gauge circuit 130 creates a false over-current discharge event by transmitting a control signal to the switch 195 to enable (close) the switch 195, thus connecting the first power line 171 to the current monitor terminal 190 and increasing the signal on the current monitor terminal 190 increases. When the second protection control circuit 140 detects the increased signal on the current monitor terminal 190, it turns off the second discharge control device 160, thus electrically isolating the battery 120. After a period of time, as determined by the processor 220 (e.g., based on the remaining capacity of the battery, battery voltage, and other relevant battery conditions), the fuel gauge circuit 130 may transmit a control signal to the switch 195 to disable (open) the switch 195 to prevent the current flow from the battery 120, through the first power line 171 and to the current monitor terminal 190. After the switch 195 has been disabled (open), the second protection control circuit 140 may keep the discharge control device 160 in the turned-off condition (i.e., latch mode) until another charge operation is started and detected by the second protection control circuit 140.

Figure 4:
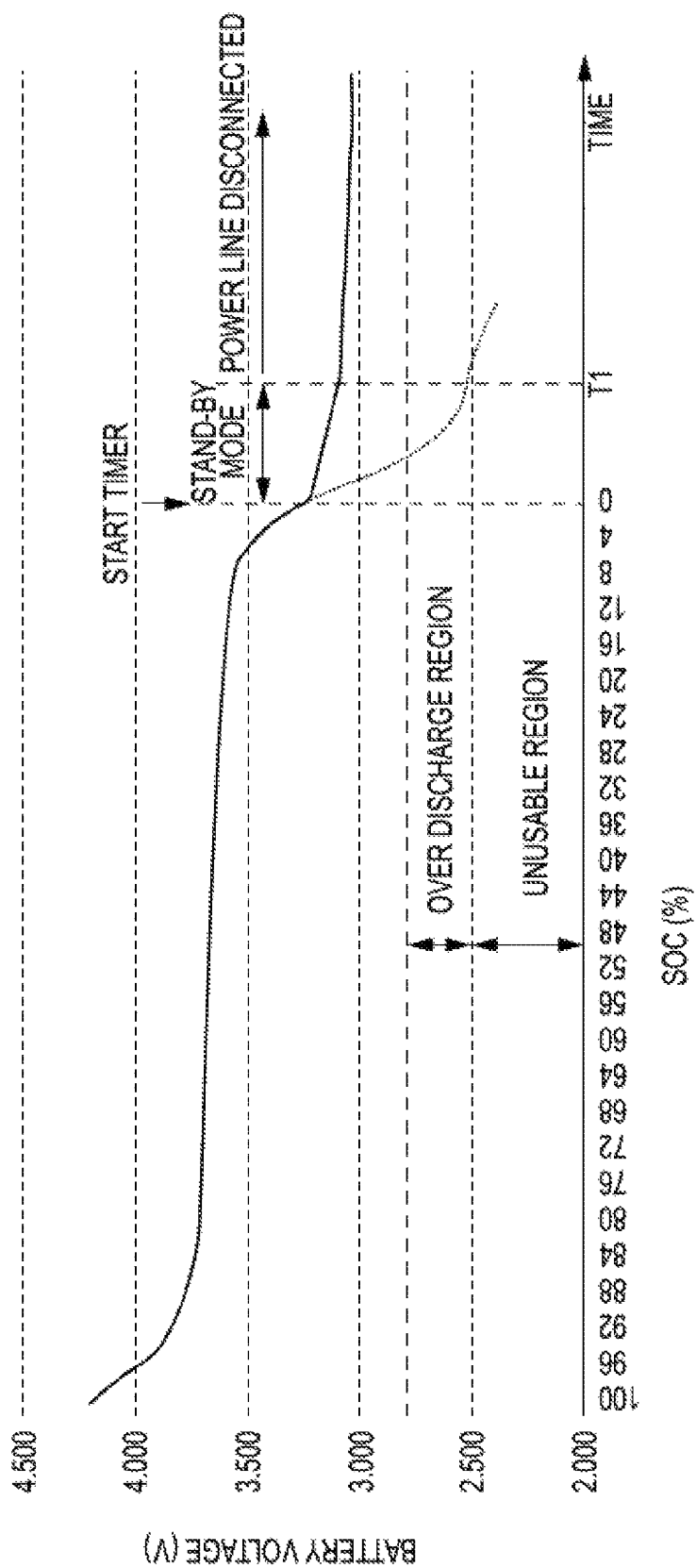
FIG. 4 is a graph illustrating battery voltage versus battery capacity in accordance with an exemplary embodiment of the present technology.

In one embodiment, and referring to FIG. 4, the third phase may further comprise a standby period, wherein after the fuel gauge circuit 130 detects an over-discharge/under-voltage event, the timer 215 may be started by the processor 220. The processor 220 may monitor the value of the timer 215 and the processor 220 doesn't initiate the process to electrically isolate the battery 120 until the timer 215 reaches a predetermined elapsed time (T1).

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An apparatus, comprising:
a battery comprising:
a positive terminal connected to a first power line; and
a negative terminal connected to a second power line;
a protection control circuit configured to monitor:
a voltage of the battery via a voltage monitor terminal connected to the second power line; and
a current of the battery via a current monitor terminal connected to the second power line;
a charge control device integrated within the second power line and responsive to the protection control circuit;
a discharge control device integrated within the second power line and responsive to the protection control circuit; and
a fuel gauge circuit configured to determine a remaining capacity of the battery, and further configured to:
connect the first power line to the current monitor terminal when the monitored voltage is less than a threshold voltage and the remaining capacity is less than or equal to a remaining capacity threshold.

2. The apparatus according to claim 1, wherein the battery, the protection control circuit, the charge control device, the discharge control device, and the fuel gauge circuit are encased in a single, physical package.

3. The apparatus according to claim 1, wherein the apparatus further comprises a first I/O terminal connected to the first power line, a second I/O terminal connected to fuel gauge circuit, a third I/O terminal connected to the fuel gauge circuit.

4. The apparatus according to claim 3, wherein the second I/O terminal is configured to transmit data and connect to an I$^2$C bus.

5. The apparatus according to claim 3, wherein the fuel gauge circuit is further configured to generate a signal indicating a request to charge the battery and apply to the signal to the third I/O terminal.

6. The apparatus according to claim 1, wherein the protection control circuit disables the discharge control device when the first power line is connected to the current monitor terminal.

7. The apparatus of claim 1, wherein the fuel gauge circuit is further configured to compute a state of health of the battery and estimate a lifespan of the battery.

8. The apparatus of claim 1, wherein the current monitor terminal comprises a sense resistor integrated into the second power line.

9. The apparatus of claim 1, wherein the fuel gauge circuit is communicatively coupled to a temperature sensor which generates a value indicating a temperature of the battery.

10. The apparatus of claim 9, where the remaining capacity of the battery is determined in part based on the temperature of the battery.

11. The apparatus of claim 9, wherein the temperature sensor is a thermistor which transmits the temperature value to the fuel gauge circuit as a voltage.

12. An apparatus, comprising:
a battery comprising:
a positive terminal connected to a first power line; and
a negative terminal connected to a second power line;
a protection control circuit configured to monitor:
a voltage of the battery via a voltage monitor terminal connected to the second power line; and
a current of the battery via a current monitor terminal connected to the second power line;

a charge control device integrated within the second power line and responsive to the protection control circuit;

a discharge control device integrated within the second power line and responsive to the protection control circuit; and a fuel gauge circuit configured to monitor the voltage of the battery, determine a remaining capacity of the battery, compare the monitored voltage to a predetermined threshold voltage, and compare the determined remaining capacity to a remaining capacity threshold, the fuel gauge circuit further configured to:

selectively connect the first power line to the current monitor terminal when the monitored voltage is less than the threshold voltage and the remaining capacity is less than or equal to the remaining capacity threshold and disconnect the first power line from the current monitor terminal after the protection control circuit disables the discharge control device.

13. The apparatus according to claim 12, wherein the fuel gauge circuit comprises a switch to selectively connect the first power line to the current monitor terminal.

14. A system, comprising:
a charger;
a host device; and
a battery pack connected to the charger and the host device, and comprising:
　a first I/O terminal, a second I/O terminal, and a third I/O terminal and a fourth I/O terminal;
　a battery comprising a positive terminal connected to the first I/O terminal via a first power line and a negative terminal connected to the fourth I/O terminal via a second power line;
　a protection control circuit connected to the second power line via a voltage monitor terminal and a current monitor terminal;
　a charge control device integrated within the second power line and responsive to the protection control circuit;
　a discharge control device integrated within the second power line and responsive to the protection control circuit; and
　a fuel gauge circuit connected to the first power line, the second I/O terminal, the third I/O terminal, and the current monitor terminal, wherein the fuel gauge circuit is configured to determine a remaining capacity of the battery, and further configured to:
　　connect the first power line to the current monitor terminal when a monitored voltage of the battery is less than a threshold voltage and the remaining capacity is less than or equal to a remaining capacity threshold.

15. The system according to claim 14, wherein the second I/O terminal is configured to transmit data between the host device and the fuel gauge circuit, and connect to an $I^2C$ bus.

16. The system according to claim 14, wherein the fuel gauge circuit is further configured to generate a signal indicating a request to charge the battery and transmit the signal to the charger via the third I/O terminal.

17. The system according to claim 14, wherein the battery, the protection control circuit, the charge control device, the discharge control device, and the fuel gauge circuit are encased in a single, physical package.

18. The system according to claim 14, wherein the protection control circuit disables the discharge control device after the first power line is connected to the current monitor terminal.

19. The system according to claim 14, wherein the fuel gauge circuit is further configured to monitor the voltage of the battery, compare the monitored voltage of the battery to the threshold voltage, and compare the determined remaining capacity to the remaining capacity threshold.

20. The system of claim 14, wherein the fuel gauge circuit is further configured to compute a state of health of the battery and estimate a lifespan of the battery.

* * * * *